(12) United States Patent
Fu et al.

(10) Patent No.: US 7,458,495 B2
(45) Date of Patent: Dec. 2, 2008

(54) FLIP CHIP BONDING TOOL

(75) Inventors: Ran Fu, Hong Kong (CN); Deming Liu, Hong Kong (CN); Chi Chuen Chaw, Hong Kong (CN); Hing Leung Li, Hong Kong (CN); Chak Hau Pang, Hong Kong (CN); Hing Suen Siu, Hong Kong (CN)

(73) Assignee: ASM Assembly Automation Ltd., Hong Kong (HK)

( * ) Notice: Subject to any disclaimer, the term of this patent is extended or adjusted under 35 U.S.C. 154(b) by 311 days.

(21) Appl. No.: 10/964,292

(22) Filed: Oct. 13, 2004

(65) Prior Publication Data

US 2006/0076391 A1   Apr. 13, 2006

(51) Int. Cl.
B23K 1/06 (2006.01)
B29C 65/08 (2006.01)
(52) U.S. Cl. .................. 228/1.1; 156/580.1; 156/580.2
(58) Field of Classification Search .......... 228/180.21, 228/1.1, 4.5, 119, 121; 148/540
See application file for complete search history.

(56) References Cited

U.S. PATENT DOCUMENTS 5,245,243 A * 9/1993 Ohnishi et al. ......... 310/323.15
5,427,301 A   6/1995 Pham et al.
2005/0079091 A1 * 4/2005 Lundberg et al. ........... 420/469

FOREIGN PATENT DOCUMENTS

| JP | 46-26212 | * | 7/1971 |
| JP | 4-152644 | * | 5/1992 |
| JP | 08085839 | * | 2/1996 |
| WO | WO 00/77265 | * | 12/2000 |

OTHER PUBLICATIONS

Toshihiro, Translation to JP 08-085839, Sep. 1994, 8 pages.*

* cited by examiner

Primary Examiner—Kiley Stoner
(74) Attorney, Agent, or Firm—Ostrolenk, Faber, Gerb & Soffen, LLP

(57) ABSTRACT

A bonding tool and method for bonding a semiconductor chip to a surface is provided wherein the bonding tool includes a bonding tip comprising a ceramic material, preferably titanium carbide. The bonding tip is operative to hold the chip and a bonding energy generator such as an ultrasonic transducer is coupled to the bonding tip for applying bonding energy to the bonding tip and the chip to bond the chip to the surface. The bonding tip may further include martensite such that the titanium carbide is present in a hard phase and the martensite is present in a soft phase as a binder for the same.

12 Claims, 2 Drawing Sheets

FLIP CHIP BONDING TOOL

FIELD OF THE INVENTION

The invention relates to a tool for attaching a semiconductor chip to a substrate, and in particular to a tool for bonding the chip to the substrate through the application of bonding energy to the chip, such as ultrasonic bonding energy.

BACKGROUND AND PRIOR ART

An electronic packaging process typically comprises various process steps that are operative to attach an integrated-circuit ("IC") chip or die to a carrier, such as a semiconductor substrate, and then forming a protective encapsulation for the resulting semiconductor device. During attachment of the IC chip, besides mechanical connections, it is important to establish electrical routes for connections between the chip and the substrate.

A chip attachment method that is becoming increasingly popular involves the use of ultrasonic bonding energy in a process referred to as ultrasonic flip chip bonding. Flip chip bonding involves a process that mechanically and electrically connects a chip to a substrate through a series of metallic bumps that are formed on the Input/Output sites on either the chip side or the substrate side. The chip or substrate side having no bumps is plated with metallic pads for facilitating metallurgical bonding of the bumps on the pads. This bonding method is implemented by contacting a tip of a bonding tool coupled to an ultrasonic transducer with a chip to be bonded. The ultrasonic transducer generates ultrasonic energy through the tip of the bonding tool, which drives the chip to scrub on the substrate to weld the bumps with the corresponding pads. As a result, the chip is mechanically stuck to the substrate with the bumps as a joint, with the bumps also acting as electrical conduits between the die and the substrate.

U.S. Pat. No. 5,427,301 entitled "Ultrasonic Flip Chip Process and Apparatus" describes one type of ultrasonic flip chip bonding. The flip chip has an active face provided with conductive bumps so that its active face is oriented toward a substrate. The flip chip is placed on the substrate with a pickup arm so that the bumps align with a bonding pattern on the substrate. An ultrasonic horn with a flat distal end is then lowered onto a back side of the flip chip and applies ultrasonic energy to create a diffusion bond between the chip and the substrate. It uses a pickup arm to transfer the chip onto the substrate and a separate ultrasonic horn to conduct ultrasonic bonding. A disadvantage of having a separate pickup arm and ultrasonic horn is that process cycle time is increased by having to move both the devices into position at each bonding location in order to bond each chip. Therefore, it is desirable to integrate the pickup tool with the ultrasonic horn to reduce the need to move multiple devices. In practice, this can be done by including a collet at the distal end of an ultrasonic horn to facilitate holding of the chip and providing means, such as vacuum suction means, to hold the flip chip securely.

FIG. 1 is a side view of a prior art bonding tool having a collet 10 that is holding a chip 12 against a substrate 14 while performing ultrasonic flip chip bonding. The chip 12 is mechanically attached to the substrate 14 through bumps 16, usually formed on the surface of the chip 12. The bumps 16 also electrically connect input/output pads 18 on the respective facing surfaces of the chip 12 and substrate 14. A working surface 20 at the tip of the collet 10 contacts the top surface of the chip 12 and applies a force to the chip 12 during bonding. In order to hold the chip 12 securely, the collet 10 also has an air passage 22 along its central longitudinal axis leading to a vacuum suction source (not shown) to apply a vacuum suction force on the chip 12. Ultrasonic energy is applied from an ultrasonic transducer (not shown) through the working surface 20 of the collet 10 onto the chip 12.

Since the collet has to hold the flip chip securely during bonding, the material used for the collet is crucial for successful bonding of the chip. A basic requirement for the material is that it should be of a high wear resistance to achieve an acceptable lifespan while producing enough friction against the top face of the chip so that the chip can be held by the collet firmly during the said ultrasonic agitation. Moreover, the material should offer high stiffness and minimal damping to the ultrasonic wave so that energy loss at the working surface or the collet itself is minimized. These various requirements pose constraints for the selection of the materials suitable for the bonding tool. A widely adopted material is cemented tungsten carbide, that is, tungsten carbide grains (hard phase) bonded together with cobalt or nickel (soft phase or binder phase), fabricated using powder metallurgy technology.

It is found that the aforesaid WC—Ni (tungsten carbide-nickel) or WC—Co (tungsten carbide-cobalt) did not work well for all bonding situations. A commonly-encountered problem is that the bonding tool cannot hold the chip tightly enough. As a result, the chip may not move harmoniously with the collet when it is driven by the ultrasonic transducer or may move totally out of the phase with the collet. Therefore, a bonding tool comprising an alternative material for making the collet of the bonding tool would be desirable to help to overcome these shortcomings.

SUMMARY OF THE INVENTION

It is therefore an object of the invention to seek to provide an improved bonding tool comprising a collet made of suitable material to bond a chip to a substrate through the use of bonding energy, so as to overcome at least some of the disadvantages of the aforementioned prior art.

According to a first aspect of the invention, there is provided a bonding tool for bonding a semiconductor chip to a surface, comprising: a bonding tip comprising titanium carbide that is operative to hold the chip and a bonding energy generator coupled to the bonding tip for applying bonding energy to the bonding tip and the chip to bond the chip to the surface.

According to a second aspect of the invention, there is provided a method for bonding a semiconductor chip to a surface, comprising the steps of: holding the chip with a bonding tip comprising titanium carbide and applying bonding energy to the bonding tip and the chip to bond the chip to the surface.

According to a third aspect of the invention, there is provided a bonding tool for bonding a semiconductor chip to a surface, comprising: a bonding tip comprising a ceramic material in a hard phase and martensite in a soft phase that is operative to hold the chip; and a bonding energy generator coupled to the bonding tip for applying bonding energy to the bonding tip and the chip to bond the chip to the surface.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of a bonding tool according to the preferred embodiment of the invention will now be described with reference to the accompanying drawings, in which.

DETAILED DESCRIPTION OF THE PREFERRED EMBODIMENT

The preferred embodiment of the present invention provides a material comprising a ceramic material, most preferably titanium carbide (TiC), for making the flip chip bonding tip or collet. The ceramic material may also consist of alumina ($Al_2O_3$), silicon carbide (SiC), boron carbide ($B_4C$) or tungsten carbide (WC). Preferably, the material for the bonding tip primarily consists of the ceramic material or titanium carbide (TiC) in a hard phase as well as martensite, such as an iron (Fe)-based martensite, in a soft phase as a binder. One example of a suitable martensite is Fe—Cr—Mo—C. For bonding a semiconductor chip to a surface, such as a substrate, the bonding tip comprising said TiC is operative to hold the chip using suction force to convey it from a pick-up position to the substrate, and cause it to contact the substrate. A bonding energy generator such as an ultrasonic transducer coupled to the bonding tip applies bonding energy to the bonding tip and chip to bond the chip to the surface.

The said composite material can be produced by a powder metallurgy ("PM") process in which the TiC powder and Fe—Cr—Mo—C based powders are mixed up thoroughly, and pressed at room temperature to form a billet. The billet is then sintered at a high temperature to make a near fully-dense PM product. The PM product thus produced consists of a hard phase comprising TiC preferably in a range of 30 to 90 % and a balanced soft phase comprising Fe—Cr—Mo—C in the form of said martensite.

Figure 1:
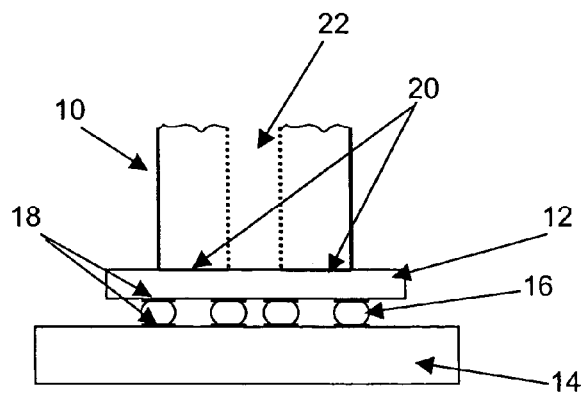
FIG. 1 is a side view of a prior art bonding tool having a collet that is holding a chip against a substrate while performing ultrasonic flip chip bonding.
Figure 2:
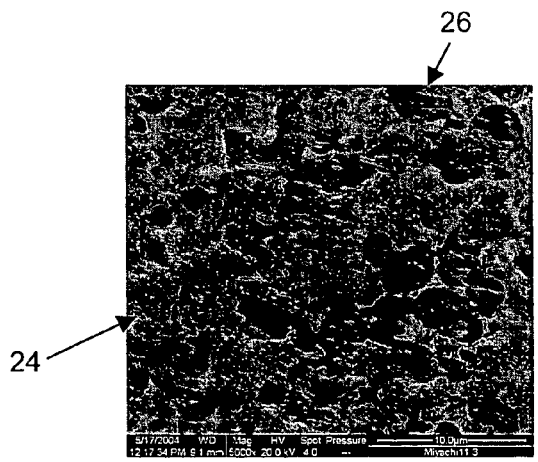
FIG. 2 is a photograph showing a surface morphology of a material according to the preferred embodiment of the invention used in the collet at conditions of relatively lower bond force and lower input power.

Examination of the working surface of the die collet under different magnitudes of bond force and input power revealed a morphological transition on the working surface of the die collet. FIG. 2 is a photograph showing a surface morphology of a material according to the preferred embodiment of the invention used in the collet at a condition of relatively lower bond force of about 0.8 kgf and lower input power of about 0.5 W. Ultrasonic bonding was performed on a 40 mil chip with nine bumps. For such relatively smaller bond forces and input power levels, it was found that the martensite (soft) phase 24 (in light grey color) tends to protrude over the TiC (hard) phase 26 (in dark grey color).

Figure 3:
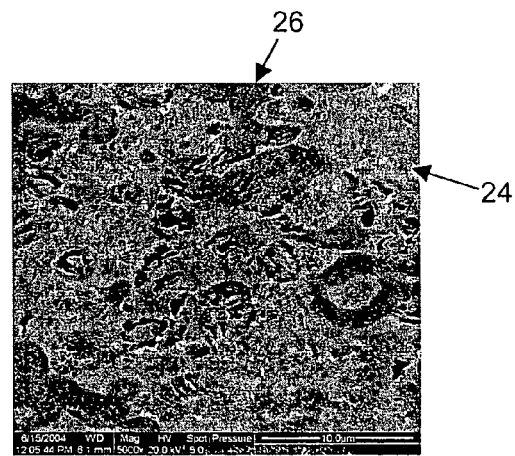
FIG. 3 is a photograph showing a surface morphology of the material according to the preferred embodiment of the invention used in the collet at conditions of relatively higher bond force and higher input power.

FIG. 3 is a photograph showing a surface morphology of the material according to the preferred embodiment of the invention used in the collet at a condition of relatively higher bond force of about 1.5 kgf, and higher input power of about 1.5 W. Ultrasonic bonding was performed here on a 40 mil chip with fourteen bumps. When larger bond forces and input power levels are used, the relative heights are reversed. In other words, the TiC phase 26 (in dark grey color) becomes protruded relative to the martensite phase 24 (in light grey color) with the result that wearing-out for both phases becomes more severe. From the above analysis, it is preferred that the bonding is carried out when the soft or martensite phase 24 protrudes over the hard or TiC phase 26 at the working surface of the die collet that is in contact with the chip.

The morphology change with changes of the bond force and input power could be understood based on some phenomenological formulations. The total bond force could be resolved into a sectional force on the hard phase and the rest on the soft phase, as denoted as $F_1$ and $F_2$. Under ultrasonic agitation from the transducer, the working surface of the collet will suffer a frictional fretting wear from contact with the top face of the die. Due to the difference in wear rates and stresses on the respective TiC and martensite phases, the heights of the two respective phases will be different with one of the phases protruding as compared with the other phase. The relative height of the protruding phase is determined by the bonding force, input power and the material constants like the Young's modulus, wear characteristic, content of the TiC phase, and geometry factors. When the morphology is stabilized with a set of bonding conditions, a change in the relative heights of the martensite phase against the TiC phase would occur due to the relaxation of the strains under the bond force, and can be obtained by the following equations:

$$\left. \begin{aligned} F_1 + F_2 &= F_0 \\ \frac{F_1 w_1}{\rho_1} &= \frac{F_2 w_2}{\rho_2} \\ h = \left( \frac{F_1}{\rho_1 E_1} - \frac{F_2}{\rho_2 E_2} \right) L_0 &= \\ F_0 L_0 \frac{w_2^2}{\rho_2^2} \left( \frac{\rho_1}{w_1} + \frac{\rho_2}{w_2} \right) \left( \frac{1}{E_1 w_1} - \frac{1}{E_2 w_2} \right) & \end{aligned} \right\} \quad \text{Equations-I}$$

where

Subscript: 0—overall, 1—martensite, 2—TiC phase

F—bonding force, h—relative height of martensite phase, $L_0$—effective length of collet, ρ—exposed area of individual phase on the working surface.

TiC is much harder and wear resistant than that of the martensite, so it could be approximated that the wear rate of TiC phase is regarded as a material constant, while the wear rate for the martensite phase is a function of the bond force and the relative velocity of the mating surface in fretting contact. The following equation is taken from Evans A. G. and Wilshaw T. R, *Acta Metallurgica*, Volume 24, pages 939-956 (1976):

$$w_1 = \alpha F^{1/4} l = \beta (FP^2)^{1/4} \quad \text{Equation-II}$$

where

α,β—material constant, l—vibration amplitude at the collet tip,

P—input power

In the above equation, it has been assumed that the fretting movement is linearly proportional to the vibration amplitude, and thus to the square root of the input power.

Incorporation of the various equations set out above leads to:

$$h \propto \left(\frac{1}{E_1 w_1} - \frac{1}{E_2 w_2}\right) \propto \gamma F^{1/4} P^{1/2} - \lambda \qquad \text{Equation-III}$$

where $\gamma, \lambda$—material constants.

Figure 4:
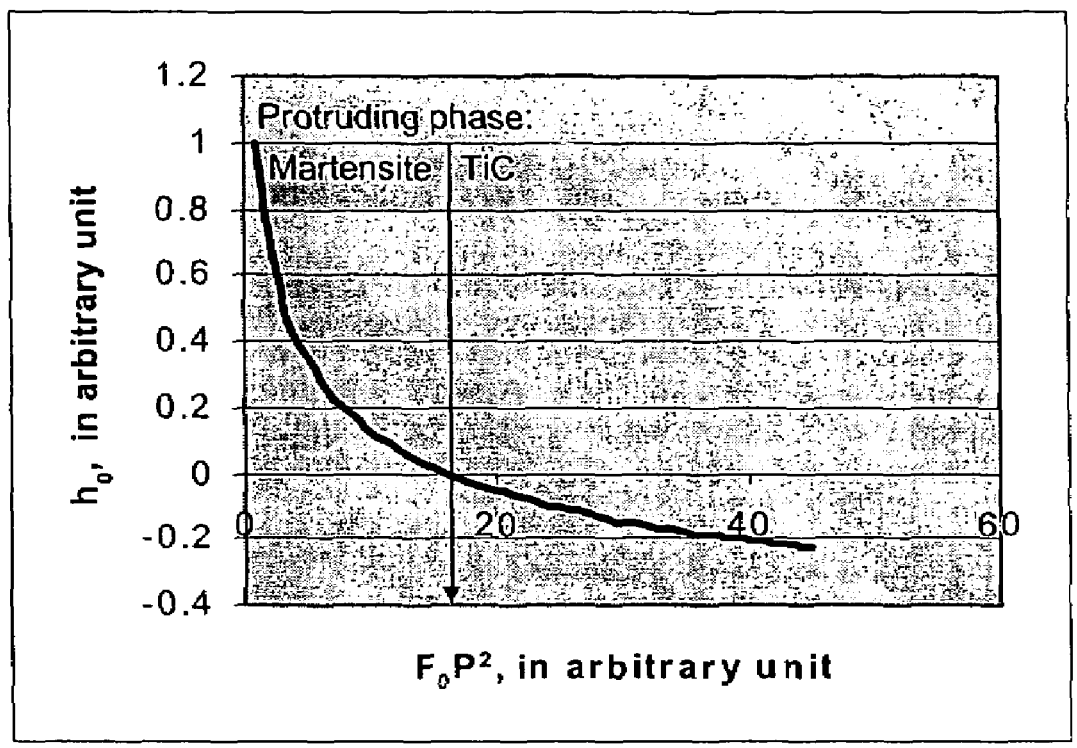
FIG. 4 is a graphical illustration of the relationship between the relative heights of the hard and soft phases of the collet material according to variations in the bond force and input power.

FIG. 4 is a graphical illustration of the relationship between the relative heights of the hard and soft phases of the collet material according to variations in the bond force and input power. From the graph, it can be seen that a transition exists where the value of h goes from positive to negative at a critical value of $F_0 P^2$. Based on the definition of h, it can be deduced that the martensite phase protrudes when h is positive, and the TiC phase protrudes when h is negative. From the above, h is negative as a result of a larger bond force and input power than the threshold value $F_0 P^2$, where the martensite phase is substantially flush with the TiC phase. This is also what is observed in the practice.

When evaluated under conditions of lower and stable energy loss and impedance, it was found that collet performs particularly well when h is positive, that is, when the martensite phase protrudes over the TiC phase. It is thus preferred that the bonding force and input power be adjusted to a level that is relatively lower than the said threshold level of $F_0 P^2$ during bonding. Selection of a material with an increased composition of TiC will help to raise the said threshold level and ensure that a positive h (corresponding to a height of a protruding martensite phase at the working surface) is obtainable to meet most bonding requirements.

According to the preferred embodiment of the invention, this composite of hard TiC particles embedded in a relatively soft martensite matrix is an improvement over prior art materials to make a bonding tool for flip chip bonding. Accordingly, a bonding tool with a collet made of the said composite material has demonstrated that it can overcome some of the disadvantages of prior art bonding tools.

The invention described herein is susceptible to variations, modifications and/or additions other than those specifically described and it is to be understood that the invention includes all such variations, modifications and/or additions which fall within the spirit and scope of the above description.

The invention claimed is:

1. A bonding tool for bonding a semiconductor chip to a surface, comprising:
   a bonding tip comprising titanium carbide in a range of 30% to 90% and martensite, the bonding tip being operative to hold the chip under an ultrasonic agitation; and
   a bonding energy generator coupled to the bonding tip for applying bonding energy to the bonding tip and the chip to bond the chip to the surface.

2. The bonding tool as claimed in claim 1, wherein said martensite comprises Fe—Cr—Mo—C.

3. The bonding tool as claimed in claim 1, wherein the titanium carbide is present in a hard phase and the martensite is present in a soft phase as a binder.

4. The bonding tool as claimed in claim 3, wherein the bonding tool is configured to conduct bonding of the chip when the soft phase protrudes over the hard phase at a working surface of the bonding tip that is in contact with the chip.

5. The bonding tool as claimed in claim 4, wherein the soft phase protrudes over the hard phase at a relatively lower bonding force and input power than a threshold level whereat the soft phase is substantially flush with the hard phase.

6. The bonding tool as claimed in claim 5, wherein the said threshold level is raisable by increasing the composition of TiC comprised in the bonding tip.

7. The bonding tool as claimed in claim 5, wherein the hard phase protrudes over the soft phase at the working surface at a relatively higher bonding force and input power than the said threshold level.

8. The bonding tool as claimed in claim 1, wherein the semiconductor chip comprises a flip chip.

9. A bonding tool for bonding a semiconductor chip to a surface, comprising:
   a bonding tip comprising a ceramic material in a hard phase and martensite in a soft phase that is operative to hold the chip under an ultrasonic agitation. the bonding tip further comprising a working surface contacting the chip during bonding, and the soft phase protrudes over the hard phase at the working surface; and
   a bonding energy generator coupled to the bonding tip for applying bonding energy to the bonding tip and the chip to bond the chip to the surface.

10. The bonding tool as claimed in claim 9, wherein the ceramic material is selected from the group consisting of: titanium carbide, alumina, silicon carbide, boron carbide and tungsten carbide.

11. The bonding tool as claimed in claim 9, wherein said martensite is iron-based.

12. The bonding tool as claimed in claim 11, wherein said martensite comprises Fe—Cr—Mo—C.

* * * * *